(12) United States Patent
Yoshizawa et al.

(10) Patent No.: US 7,452,217 B2
(45) Date of Patent: Nov. 18, 2008

(54) CONNECTING MEMBER FOR SURFACE MOUNTING CIRCUIT

(75) Inventors: Norio Yoshizawa, Tokyo (JP); Hiroaki Watanabe, Tokyo (JP)

(73) Assignee: Sankyo Kasei Co., Ltd., Ota-Ku, Tokyo (JP)

( * ) Notice: Subject to any disclaimer, the term of this patent is extended or adjusted under 35 U.S.C. 154(b) by 58 days.

(21) Appl. No.: 11/473,247

(22) Filed: Jun. 22, 2006

(65) Prior Publication Data

US 2007/0298630 A1  Dec. 27, 2007

(51) Int. Cl.
*H01R 12/00* (2006.01)
*H05K 1/00* (2006.01)

(52) U.S. Cl. .............................. 439/83; 439/91; 439/591

(58) Field of Classification Search .................... 439/83, 439/66, 91, 591
See application file for complete search history.

(56) References Cited

U.S. PATENT DOCUMENTS

| | | | | |
|---|---|---|---|---|
| 5,045,249 A | * | 9/1991 | Jin et al. ..................... | 264/437 |
| 5,586,892 A | * | 12/1996 | Sato ............................ | 439/91 |
| 5,819,406 A | * | 10/1998 | Yoshizawa et al. ............ | 29/877 |
| 6,265,673 B1 | * | 7/2001 | Higashida et al. ........... | 174/260 |
| 6,331,119 B1 | * | 12/2001 | Bernier et al. ................ | 439/91 |
| 6,332,786 B1 | * | 12/2001 | Suga et al. ................... | 439/91 |
| 6,407,345 B1 | * | 6/2002 | Hirose et al. ................ | 174/261 |
| 6,592,783 B2 | * | 7/2003 | Kumakura et al. .......... | 252/500 |
| 7,134,879 B2 | * | 11/2006 | Sugimoto et al. ............ | 439/66 |
| 7,258,549 B2 | * | 8/2007 | Asahi et al. .................. | 439/66 |

FOREIGN PATENT DOCUMENTS

| | | |
|---|---|---|
| JP | 5-006789 | 1/1993 |
| JP | 5-304356 | 11/1993 |
| JP | 8-138773 | 5/1996 |

* cited by examiner

*Primary Examiner*—Hae Moon Hyeon
(74) *Attorney, Agent, or Firm*—Jordan and Hamburg LLP

(57) ABSTRACT

A circuit pattern is formed on a printed circuit board, and a plating surface of a projecting stripe on a substrate is connected to the circuit pattern by soldering. Further, adhesive agent is filled in a gap between a coarsened surface of a non-circuit unit and the printed circuit board. When the adhesive agent is filled in the gap, the adhesive agent comes in an uneven portion of the coarsened non-circuit unit and is hardened in the recessed portion, so that a chemical bonding force of the adhesive agent itself and an anchoring effect act. For this reason, a fixing force and the bonding force increase.

17 Claims, 6 Drawing Sheets

CONNECTING MEMBER FOR SURFACE MOUNTING CIRCUIT

BACKGROUND OF THE INVENTION

1. Field of the Invention

The present invention relates to a connecting member for surface mounting circuit for mobile phone and the like.

2. Description of the Related Art

Previously, for connecting a metal connecting member, for a surface mounting circuit with a circuit, pattern of a main circuit board, soldering of a metal terminal of the connecting member and the circuit pattern provides a sufficient connecting strength. However, recent electronic devices are equipped with multiple functions; mobile phone has such functions as digital camera, Internet tool, GPS apparatus, and television. Electronic devices' multi-functionization and miniaturization causes a need to make both the width of a circuit pattern on a printed circuit board and the pitch between those circuit patterns much narrower into a micron order. In such a situation, the conventional mechanical connection by soldering no longer provides a sufficient connecting strength. Therefore, in recent years, an insulating adhesive agent is used for reinforcing the connecting strength.

The above-mentioned functions such as digital camera, television, GPS, inter-net, and the like are mounted on a small board of the sub-board and made into a module. A connecting member for mounting those functional members on a printed circuit board is connected to the printed circuit board by mechanical bonding with soldering and by chemical bonding with adhesive agent.

The substrate of the connecting member is made of electrically insulating thermoplastic resin such as liquid crystal polymer, heat-resistant polyamide, or polyphenylene sulfide, and is formed by injection-molding of those resins. However, a property of good adhesion does not belong to any of the liquid crystal polymer, heat-resistant polyamide, and polyphenylene sulfide.

Further, it is inevitable that portable mobile electronic devices such as a mobile phone, portable computer, or digital camera, drop by accident while handled. If a mobile phone drops, a weight of its own multiple function module mounted on the sub-board directly hits its own printed circuit board, to break the electric connection between the printed board and the module.

Facing such a new problem of accidental dropping of the electronic devices, increase of adhesive strength between their connecting member and electronic circuit board is desired to improve their shock resistance level against dropping.

BRIEF SUMMARY OF THE INVENTION

Therefore, it is an object of the present invention to provide a connecting member for surface mounting circuit board, which improves its shock resistance level against dropping even though the substrate of the connecting member is injection-molded of electrically insulating thermoplastic resin such as liquid crystal polymer, heat-resistant polyamide, or polyphenylene sulfide.

The first feature of the present invention is to provide a connecting member for surface mounting circuit to be connected with an electronic circuit board by soldering or bonding. The substrate of the connecting member is molded of electrically insulating resin. A circuit portion and a non-circuit portion are formed on the surface of the substrate. The non-circuit portion has a coarsened surface. Adhesive agent is applicable to the coarsened surface.

The second feature of the present invention is to provide the connecting member for surface mounting circuit according to the first feature thereof, wherein the entire surface of the substrate is coarsened, and the surface of the circuit portion thereof is plated.

The third feature of the present invention is to provide a connecting member for surface mounting circuit to be connected with an electronic circuit board. The substrate of the connecting member is molded of electrically insulating resin. A circuit portion and a non-circuit portion are formed on the surface of the substrate. The non-circuit portion has a coarsened surface. The electronic circuit board is connected with the non-circuit portion of the substrate, whose surface is coarsened, by using non-conductive adhesive agent that contains electrically conductive particles. Also, the circuit pattern of the electronic circuit board is connected with the circuit portion of the substrate by using the same non-conductive adhesive that contains electrically conductive particles.

The fourth feature of the present invention is to provide the connecting member for surface mounting circuit according to the third feature thereof, wherein the non-conductive adhesive agent containing electrically conductive particles is an anisotropic conductive adhesive film.

The fifth feature of the present invention is to provide a connecting member for surface mounting circuit to be connected with an electronic circuit board. The substrate of the connecting member is molded of electrically insulating resin. A circuit portion and a non-circuit portion are formed on the surface of said substrate. The non-circuit portion has a coarsened surface. The electronic circuit board is connected with the non-circuit portion of the substrate, whose surface is coarsened, by using cream soldering agent that also serves as adhesive agent. Also, the circuit pattern of the electronic circuit board is connected with the circuit portion of the substrate by using the same cream soldering agent that also serves as adhesive agent.

Effect of the present invention is such that only one application of chemical etching to the substrate of the connecting member provides a rigid and tight connection between the connecting member and the electronic circuit board by both plating and adhesive agent, to efficiently prevent peeling by an external impact. Thereby, high productivity and quality improvement is realized. Even if portable mobile devices such as mobile phone drop, the tight and rigid connection between the connecting member and the electronic circuit board prevents or considerably reduces their disconnection.

BRIEF DESCRIPTION OF THE DRAWINGS

FIGS. 6A and 6B are developments of still another embodiment, in which FIG. 6A is a sectional view showing a pre-stage of steps, and FIG. 6B is a sectional view showing a post-stage of the steps.

DETAILED DESCRIPTION OF THE INVENTION

Figure 1:
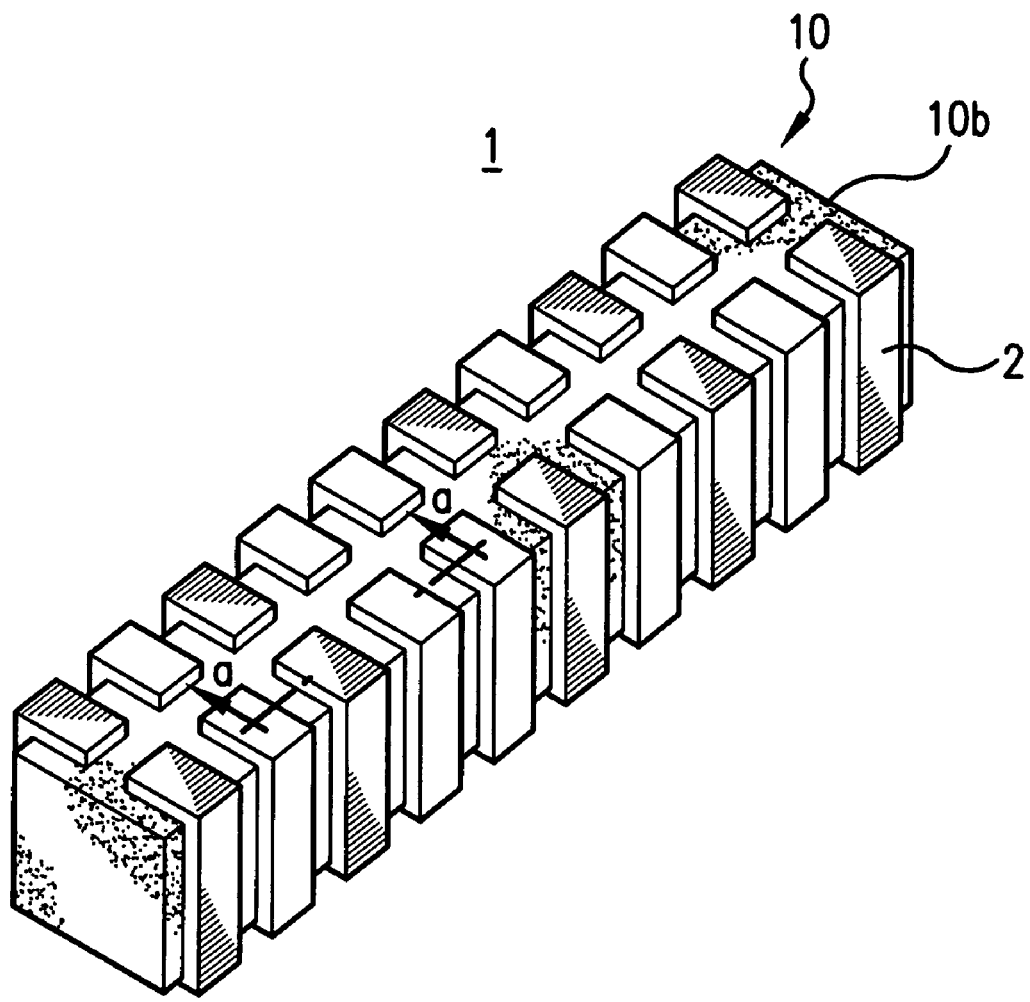
FIG. 1 is a perspective view of a connecting member.
Figure 2:
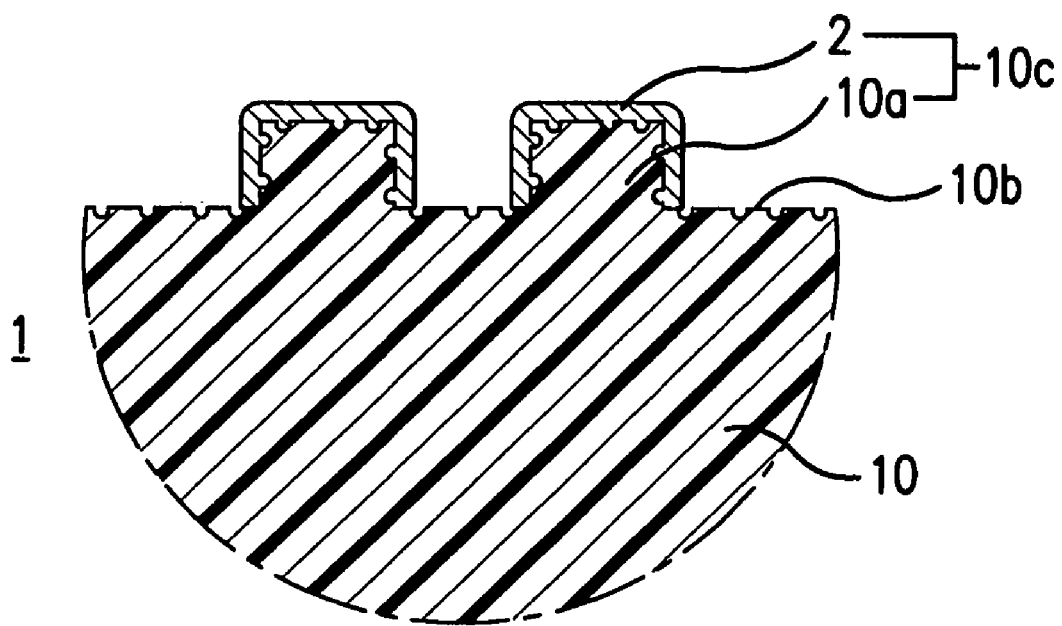
FIG. 2 is an enlarged sectional view taken along the line a-a in FIG. 1.

An embodiment of the connecting member for surface mounting circuit according to the present invention is described below with reference to the accompanying drawings. As shown in FIGS. 1 and 2, a connecting member 1 is to be connected with an electronic circuit board 3 by soldering or gluing. A substrate 10 of the connecting member 1 is molded of electrically insulating thermoplastic resin such as liquid crystal polymer, heat-resistant polyamide, or polyphenylene sulfide as the raw material. A projection 10a for connection is formed integrally with the substrate 10. On the surface of the substrate 10, the projection 10a and a plating 2 applied to the surface of the projection 10a compose a circuit portion 10c. The rest of the surface of the substrate 10 is a non-circuit portion 10b, which is kept coarsened.

Next, process for manufacturing the substrate 10 of the connecting member 1 is described below. The substrate 10 is molded into a contour corresponding to its finish by injecting a plating-grade liquid crystal polymer into mold cavity. As the liquid crystal polymer, aromatic polyester ("VECTRA" (trade name of Polyplastics Co., Ltd.)) is used.

Then, the entire surface of the substrate 10 is subjected to coarsening (etching) process. The etching process is conducted by dipping the substrate 10 in an alkaline aqueous solution for a predetermined period of time, e.g. 30 minutes. The alkaline aqueous solution is obtained by solving sodium hydroxide or potassium hydroxide in water at a predetermined concentration, e.g. 45 wt %, and is subsequently heated to a predetermined temperature, e.g. 50 to 90° C. Thereby, the entire surface of the substrate 10 is coarsened.

Next, the substrate 10 is again inserted into the mold cavity. "ECOMATY AX" (trade name of Nippon Synthetic Chemical Industry Co., Ltd.), an oxyalkylene-group-containing polyvinyl alcohol resin, is injected into the cavity to coat only a portion of the surface of substrate 10 corresponding to the non-circuit portion 10b thereof. Namely, the rest of the surface of the substrate 10 corresponding to the projection 10a thereof is not coated with the resin, by which the projection 10a is left exposed.

Then, the surface of the projection 10a is provided with catalyst such as palladium, gold, or the like. For applying catalyst, any of the well-known methods is available. In one method, the substrate 10 is dipped in mixed catalyst solution of tin- and palladium-base before the substrate 10 is activated by acid such as hydrochloric acid or sulfuric acid. Thereby, palladium is deposited on the surface of the substrate 10. In another method, a relatively strong reducer such as stannous chloride is adsorbed on the surface of the substrate 10. Then, the substrate 10 is dipped in a catalyst solution that contains noble metal ions such as gold ions at a temperature ranging from 15 .degree. C. to 23 .degree. C. for 5 minutes. Thereby, gold is deposited on the surface of the substrate 10.

Next, the substrate 10 is put in hot water at 60° C. for 10 minutes to heat the substrate 10, before ECOMATY AX, the coating agent, solves into the hot water. In FIG. 1 the projections 10a on a top side are arranged in first and second groups separated by the non-circuit portion 10b recessed below the projections 10a.

Then, the surface of the projection 10a, which is coarsened in the previous step, is applied with plating 2. For conducting plating process, either chemical copper plating or chemical nickel plating is available. The plating 2 strongly adheres to the surface of the projection 10a by anchor effect. Other methods are substituted for this plating process. Conductive thin film may be applied to the surface of the projection 10a, or a metal terminal may be fitted on the surface thereof.

Finally, the substrate 10 is heated to remove moisture in its structure, completing the plating. Thereby, on the surface of the substrate 10, the circuit portion 10c consisting of the projection 10a and the plating 2 applied to the surface of the projection 10a is formed, and the connecting member 1 having the substrate 10 shown in FIGS. 1 and 2 is completed.

Figure 3:
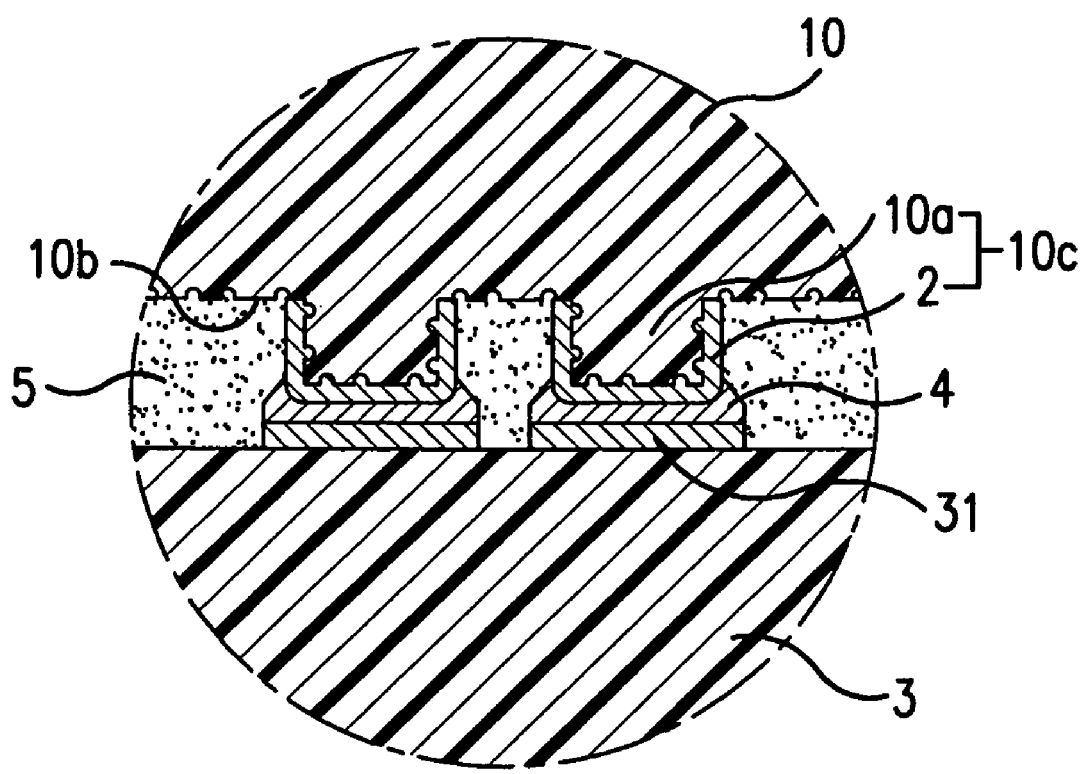
FIG. 3 is an enlarged sectional view showing a state in which the connecting member is connected to an electronic circuit board.

Next, a process for connecting the substrate 10 of the connecting member 1 to a printed circuit board 3 that serves as electronic circuit board is described. As shown in FIG. 3, a circuit pattern 31 is formed on the printed circuit board 3. The circuit portion 10c of the substrate 10 is connected to the circuit pattern 31 by solder 4. Further, adhesive agent 5 can be applied to the surface of the non-circuit portion 10b, which is coarsened. More specifically, the adhesive agent 5 is injected into a gap between the non-circuit portion 10b and the electronic circuit board 3. Epoxy adhesive is used for the adhesive agent 5. When the adhesive agent 5 is injected into the gap, as the non-circuit portion 10b is coarsened, the adhesive agent 5 permeates into the uneven portion of the non-circuit portion 10b, especially the recessed portion thereof, before it stiffens there. Consequently, in addition to the chemical bonding force of the adhesive agent, anchoring effect, i.e. a mechanical and physical anchoring effect, is provided. Thereby, the fixing and bonding force considerably increases to secure sufficient impact-resistant and peel-resistant forces against the external force caused by the electronic devices' dropping or the like.

Figure 4:
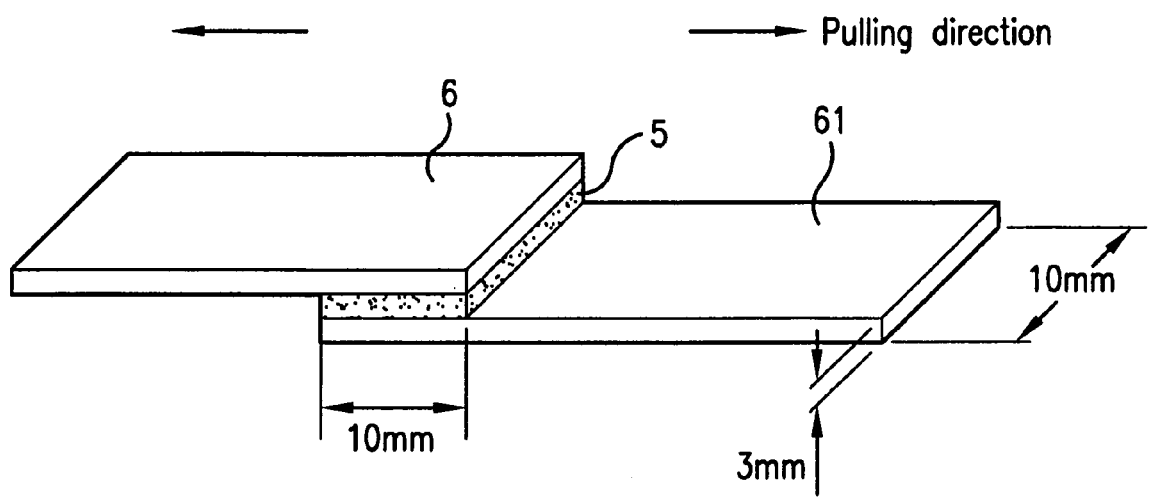
FIG. 4 is a perspective view showing an experiment of the present invention.

An experiment on the peel-resistant force of the adhesive surface according to the present invention is described with reference to FIG. 4. A test-piece 6 is adhered to the other test-piece 61 by the adhesive agent 5. Each test-piece 6, 61 is made of previously mentioned "VECTRA" (trade name of Polyplastics Co., Ltd.), and has a width of 10 mm and a thickness of 3 mm. Length of the test-piece 6 is 30 mm while the test-piece 61 is 40 mm. Epoxy adhesive (product number AW106 available from Vantico AG) is used as adhesive agent. Adhering is conducted by heating them at 125° C. for one hour for stiffening. Etching process is conducting by dipping the test pieces in an aqueous solution containing 40 wt % of potassium hydroxide (KOH) for 25 minutes, and heating them at 70° C. for 20 minutes.

The test pieces on which the etching process is conducted and those not subjected to the etching process are respectively tensed outward at a tensile speed of 1.7.times.10.sup.−4 m/s in horizontal directions to compare peel-resistant forces of the adhesive surfaces of the adhesive agents 5 between them.

The experiment shows that the processed test piece has a peel-resistant force of 15 megapascals (MPs) and that the unprocessed test piece has a peel-resistant force of 5 MPs. It means that the peel-resistant strength of the processed test piece is three times stronger than that of the unprocessed test piece.

In the above-described embodiment, the circuit portion 10c of the substrate 10 is connected to the circuit pattern 31 of the printed circuit board 3 by the solder 4 before the adhesive agent 5 is injected into the gap between the non-circuit portion 10b and the electronic circuit board 3 to connect the electronic circuit board 3 and the substrate 10. Namely, the two steps, i.e., the soldering step and the adhesive-agent-injecting step, are required.

Figure 5:
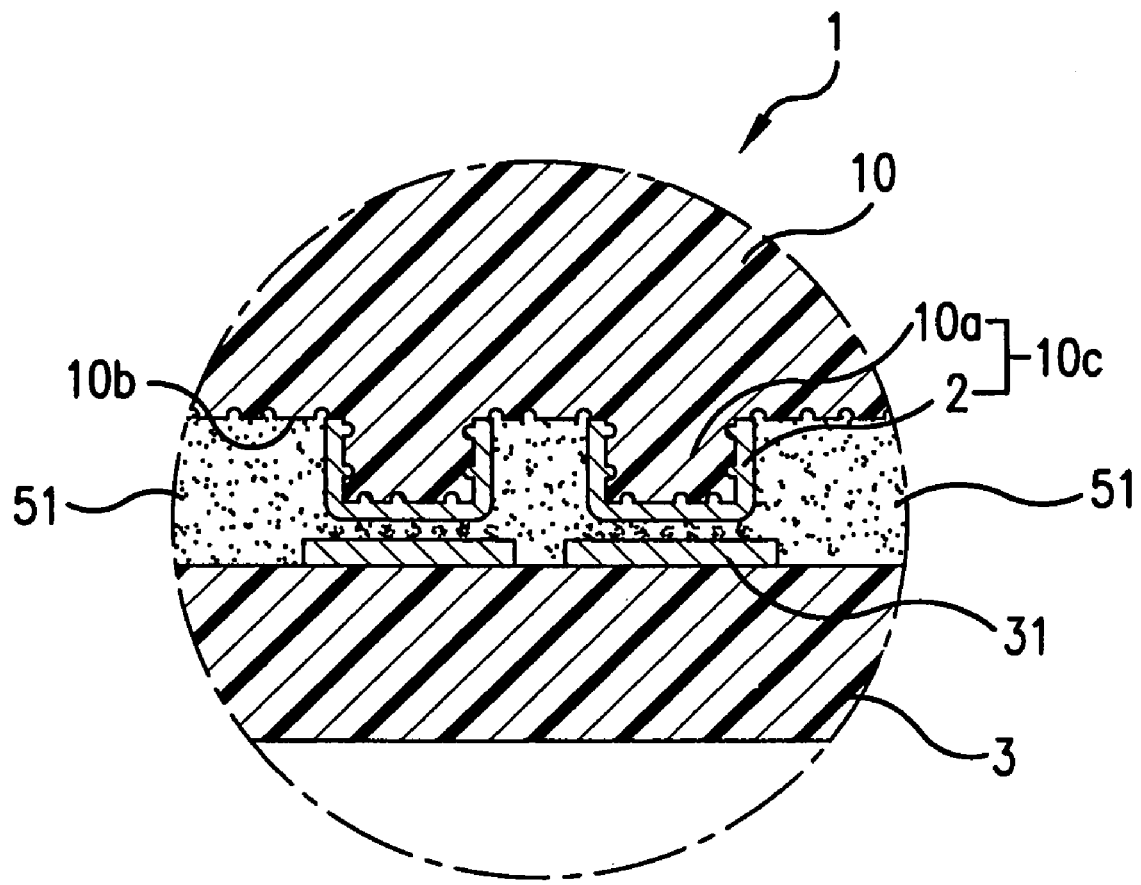
FIG. 5 is an enlarged sectional view showing a state in which a connecting member according to another embodiment is connected to an electronic circuit board.

In the following description, another embodiment is explained with reference to FIG. 5. In this embodiment, only one step is required for connecting a circuit pattern 31 of an electronic circuit board 3 to a circuit portion 10c of a substrate 10 as well as for connecting a coarsened non-circuit portion 10b to the electronic circuit board 3.

This embodiment is also to connect a connecting member 1 with a printed circuit board 3 serving as an electronic circuit board as the previous embodiment. A substrate 10 of the connecting member 1 is molded of electrically insulating resin such as electrically insulating thermoplastic resin, and the same raw material is applied as those in the previous embodiment. A projection 10a for connection is integrally formed on the substrate 10. On the surface of the substrate 10, a circuit portion 10c is formed with the projection 10a and a plating 2 applied to the surface of the projection 10a. The rest of the surface of the substrate 10 is a non-circuit portion 10b.

Next, process for manufacturing the substrate 10 of the connecting member 1 is described below. The contour of the substrate 10 corresponds to that of its finish.

The substrate 10 is molded by injecting a plating-grade liquid crystal polymer into mold cavity. Liquid crystal polymer is the same as previously described.

Then, the entire surface of the substrate 10 is subjected to coarsening (etching) process. The etching process is the same as previously described.

Next, the substrate 10 is inserted into the mold cavity again. "ECOMATY AX" (the trade name previously described), an oxyalkylene-group-containing polyvinyl alcohol resin, is injected into the cavity to coat only a portion of the surface of the substrate 10 corresponding to the non-circuit portion 10b thereof. Namely, the rest of the surface of the substrate 10 corresponding to the projection 10a thereof is not coated with the resin, by which the projection 10a is left exposed.

Then, the surface of the projection 10a is provided with catalyst such as palladium, gold, or the like. For applying catalyst, well-known method is available.

Next, the substrate 10 is put in hot water and is heated under the same condition as previously described, before ECOMATY AX, the coating agent, solves into the hot water.

Then, the surface of the projection 10a, which is coarsened previously, is applied with plating 2. For conducting plating process, either chemical copper plating or chemical nickel plating is available. The plating 2 strongly adheres to the surface of the projection 10a by anchor effect. Other methods are substitute for this plating process. Conductive thin film may be applied to the surface of the projection 10a, or a metal terminal may be fitted on the surface thereof.

Finally, the substrate 10 is heated to remove moisture in the structure thereof. Thereby, on the surface of the substrate 10, a circuit portion 10c is formed with the projection 10a and the plating 2 applied to the surface of the projection 10a is formed, and the connecting member 1 having the substrate 10 shown in FIG. 5 is completed.

Next, process for mounting the substrate 10 of the connecting member 1 onto a printed circuit board 3 that serves as electronic circuit board is described. A circuit pattern 31 is formed on the printed circuit board 3. One non-conductive adhesive agent containing electrically conductive particles is used for connecting the circuit pattern 31 with the circuit portion 10c as well as for connecting the non-circuit portion 10b and the non-circuit surface of the printed circuit board 3. An example of the non-conductive adhesive agents, which contains silver fine particle as the electrically conductive particle, is anisotropic conductive adhesive film 51 (ThreeBond 3370C (trade name) or ThreeBond 3370D (trade name) available from Three Bond Co., Ltd.).

For adhering, the anisotropic conductive adhesive films 51 is applied both into a gap between the circuit pattern 31 and the circuit portion 10c and into a gap between the non-circuit portion 10b and the printed circuit board 3, and is heated under pressure.

As the anisotropic conductive adhesive film 51 that is used here has the property of going solid at a cure temperature of about 60° C. to 120° C., adhering by use of the anisotropic conductive adhesive film is suitably applied to a portion such as liquid crystal display. Namely, as the electrode of such portion is made of a thin film of ITO (Indium Tin Oxide) having a thickness of several hundred angstroms and is so poor in heat resistance as not to withstand soldering heat, its adhering is conducted by heating and press-bonding under pressure to a temperature not so high as the soldering heat. Heating and press-bonding device is obtained by applying aluminum and silicon rubber to the lower surface of a heated plate. The device pressures the connecting member 1 placed on an operating stand.

The connection by the anisotropic conductive adhesive film 51 is performed by only one step for heating under pressure. The circuit pattern 31 and the circuit portion 10c are connected to each other in an electrically conductive state by electrically conductive particles. On the other hand, the non-circuit portion 10b and the non-circuit surface of the electronic circuit board 3 are connected in a non-electrically-conductive state because the electrically conductive particle is suspended in the adhesive agent. As the adhesive agent, an epoxy adhesive is used. When the adhesive agent permeates into the uneven portion of the non-circuit portion 10b with the coarsened surface, especially into the recessed portion thereof, and stiffens there, an anchoring effect, i.e. a mechanical and physical anchor effect, is provided in addition to the chemical bonding force of the adhesive agent. Thereby, the fixing force and the bonding force considerably increase to secure a sufficient impact-resistant and peel-resistant forces against the external force caused by fall or the like.

Still another embodiment is explained below with reference to FIG. 6.

This embodiment also to connect a substrate 10 of a connecting member 1 with a circuit pattern 31 of a printed circuit board 3 serving as an electronic circuit board. The substrate 10 is molded of electrically insulating resin. Of the surface of the substrate 10, a projection 10a, i.e. circuit portion of the substrate 10, is applied with plating 2. The rest of the surface of the substrate 10 is a non-circuit portion, which is coarsened previously. Those structures and manufacturing processes are the same as the previous embodiments The characteristic feature of this embodiment is the use of cream solder 52, which also serves as adhesive agent, both for connecting the non-circuit surface of the printed circuit board 3 with the non-circuit portion 10b of the substrate 10 and for connecting the circuit pattern 31 of the printed circuit board 3 with the circuit portion 10c. The embodiment is especially applicable to the adhesion of soldering-heat-resistant items such as mounting a connector on a printed circuit board.

Next, a process is explained, by which the substrate 10 of the connecting member 1 completed in the same way as the previous embodiment is connected with the printed circuit board 3 serving as the electronic circuit board. Cream solder 52, which also serves as an adhesive agent, is used for connecting the circuit pattern 31 with the circuit portion 10c and for connecting the non-circuit portion 10b with the non-circuit surface of the printed circuit board 3. The cream solder 52 is a mixture of solder metal powder and adhesive flux, and its representative product is co-developed by Senju Metal Industry Co., Ltd. and TDK Corporation, sold under the trade name "Under Fill Paste #2000".

Figure 6A:
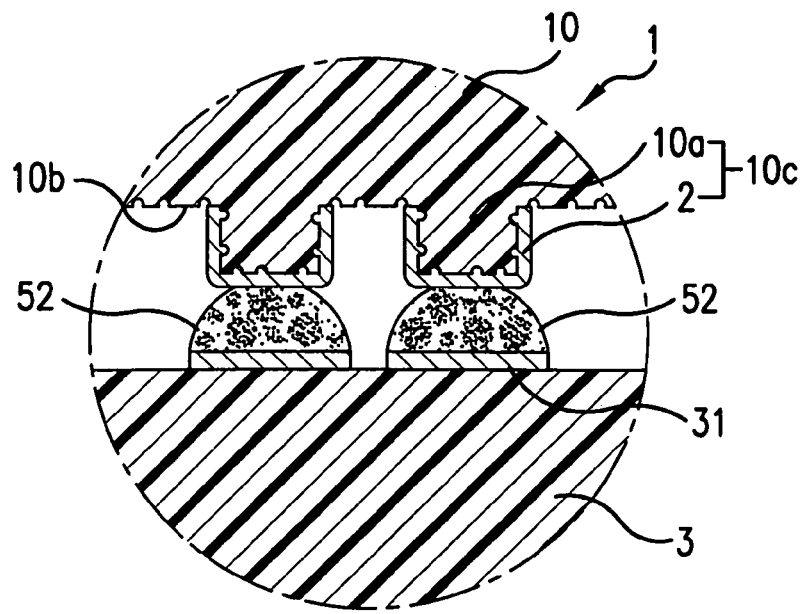

As shown in FIG. 6(A), adhering step is conducted in such a way that the cream solder 52 also serving as an adhesive agent is applied into a gap between the circuit pattern 31 and the circuit portion 10c and is heated. However, the adhering step requires no pressurization. Namely, it is conducted without under pressure.

In the process of coating and heating of the cream solder 52 also serving as an adhesive agent, the viscosity of the adhesive flux contained therein decreases.

Then, solder particles agglutinate by Van-der-Waals Bonding and the influence of gravity, and inter-metallic bonding occurs between the circuit pattern 31 and the circuit portion 10c of the substrate 10 so that the adhesive flux component is removed to the outside.

Thereafter, a flux resin component is solidified by a cross-linking reaction to complete the bonding.

Figure 6B:
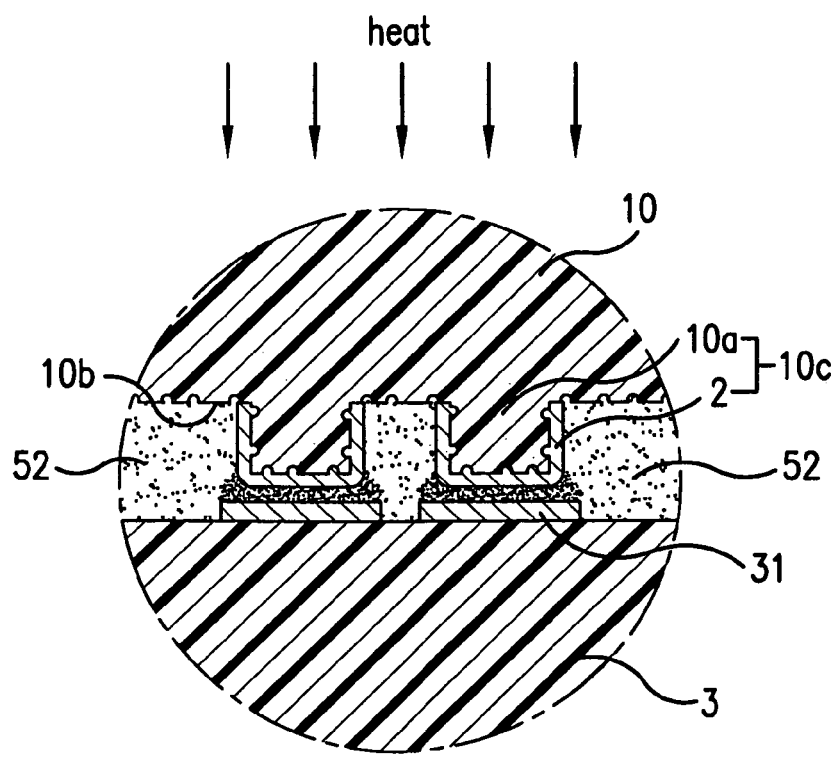

Consequently, as shown in FIG. 6B, the circuit pattern 31 is connected with the circuit portion 10c in the state of intermetallic bonding by soldering, by which they are electrically connected with each other on one hand. On the other hand, the non-circuit portion 10b having the coarsened surface is connected with the non-circuit surface of the printed circuit board 3 by the adhesive flux resin component as an adhesive agent. By the synergistic effect of those soldering and adhesion, the substrate 10 of the connecting member 1 is mechanically connected to the circuit pattern 31 of the printed circuit board 3 tightly. Particularly, as the adhesive flux resin component permeates into the uneven portion of the non-circuit portion 10b with coarsened surface, especially the recessed portion thereof and stiffens there, an anchoring effect, i.e. mechanical and physical anchor effect, is provided in addition to the chemical bonding force of the flux resin. Thereby, the fixing force and the bonding force considerably increase to secure sufficient impact-resistant and peel-resistant forces against the external force caused by fall or the like.

According to the embodiment, the adhesion by use of the cream solder 52 also serving as an adhesive agent requires only one step, i.e. heating.

The present invention is applied to connecting members such as a connector mounted on a circuit board for mobile phone, digital camera, notebook personal computer, or the like by soldering and adhesive agent, as the circuit board requires high impact resistance against falling.

What is claimed is:

1. A surface mount electronic assembly, comprising:
   an electronic circuit board having circuit board conductive pattern areas and circuit board non-conductive areas;
   a connecting member substrate molded of electrically insulating resin;
   said connecting member substrate having a surface with a circuit portion formed thereon which is conductive, and non-circuit portion areas which are non-conductive, said surface being on a bonding side of said connecting member substrate;
   said surface of said connecting member substrate in said non-circuit portion areas being a coarsened surface;
   a non-conductive adhesive agent connecting said coarsened surface of said non-circuit portion areas to said circuit board non-conductive areas; and
   said circuit portion being connected to said circuit board conductive pattern areas by solder.

2. The surface mount electronic assembly according to claim 1, wherein an entire surface of said connecting member substrate is a coarsened surface, and said circuit portion is plated on said coarsened surface.

3. The surface mount electronic assembly according to claim 1, wherein:
   said surface of said connecting member substrate includes projections formed of said electrically insulating resin which support said circuit portion and which recess at least a portion of said non-circuit portion areas with respect to said circuit portion;
   said projections having side walls, ones of said side walls facing and opposing ones of said side walls of adjacent ones of said projections; and
   said non-conducting adhesive is disposed between said facing and opposing ones of said side walls and is bonded to said coarsened surface of said non-circuit portion areas between said facing and opposing ones of said side walls so as to provide an anchoring by virtue of the non-conductive adhesive agent being between said facing and opposing ones of said side walls.

4. The surface mount electronic assembly according to claim 3, wherein top walls of said projections and said side walls are covered by said circuit portion.

5. The surface mount electronic assembly according to claim 4, wherein:
   said connecting member substrate has first and second opposing substrate sides adjoining said bonding side, and said bonding side faces said electronic circuit board; and
   each of said projections is formed as a rib extends over a portion of said bonding side and a portion of at least one of said first and second opposing substrate sides so as to extend said circuit portion thereon to be on a corresponding one of said first and second opposing substrate sides.

6. The surface mount electronic assembly according to claim 5, wherein said projections on said bonding side are arranged in first and second groups respectively having said projections thereof extend onto said first and second opposing substrate sides, and said first and second groups are separated by said non-circuit portion areas recessed below said projections.

7. A surface mount electronic assembly, comprising:
   an electronic circuit board having circuit board conductive pattern areas and circuit board non-conductive areas;
   a connecting member substrate molded of electrically insulating resin;
   said connecting member substrate having a surface with a circuit portion formed thereon which is conductive, and non-circuit portion areas which are non-conductive, said surface being on a bonding side of said connecting member substrate;
   said surface of said connecting member substrate in said non-circuit portion areas being a coarsened surface;
   an adhesive mixture including a non-conductive adhesive agent and electrically conductive particles dispersed in the non-conductive adhesive agent;
   said adhesive mixture bonding said circuit board non-conductive areas to said non-circuit portion areas; and
   said adhesive mixture bonding the circuit board conductive pattern areas of said electronic circuit board to said circuit portion of said connecting member substrate.

8. The surface mount electronic assembly according to claim 7, wherein the adhesive mixture containing said electrically conductive particles forms an anisotropic conductive adhesive film.

9. The surface mount electronic assembly according to claim 7, wherein:
   said surface of said connecting member substrate includes projections formed of said electrically insulating resin which support said circuit portion and which recess at least a portion of said non-circuit portion areas with respect to said circuit portion;
   said projections having side walls, ones of said side walls facing and opposing ones of said side walls of adjacent ones of said projections; and said non-conducting adhesive is disposed between said facing and opposing ones of said side walls and is bonded to said coarsened surface of said non-circuit portion areas between said facing and opposing ones of said side walls so as to provide an anchoring by virtue of the non-conductive adhesive agent being between said facing and opposing ones of said side walls.

10. The surface mount electronic assembly according to claim 9, wherein top walls of said projections and said side walls are covered by said circuit portion.

11. The surface mount electronic assembly according to claim 10, wherein:

said connecting member substrate has first and second opposing substrate sides adjoining said bonding side, and said bonding side faces said electronic circuit board; and each of said projections is formed as a rib extends over a portion of said bonding side and a portion of at least one of said first and second opposing substrate sides so as to extend said circuit portion thereon to be on a corresponding one of said first and second opposing substrate sides.

12. The surface mount electronic assembly according to claim 11, wherein said projections on said bonding side are arranged in first and second groups respectively having said projections thereof extend onto said first and second opposing substrate sides, and said first and second groups are separated by said non-circuit portion areas recessed below said projections.

13. A surface mount electronic assembly, comprising:

an electronic circuit board having circuit board conductive pattern areas and circuit board non-conductive areas;

a connecting member substrate molded of electrically insulating resin;

said connecting member substrate having a surface with a circuit portion formed thereon which is conductive, and non-circuit portion areas which are non-conductive, said surface being on a bonding side of said connecting member substrate;

said surface of said connecting member substrate in said non-circuit portion areas being a coarsened surface;

a cream soldering agent which includes a resin as a non-conductive adhesive agent, said cream soldering agent bonding said circuit board non-conductive areas to said non-circuit portion areas; and said cream soldering agent bonding the circuit board conductive pattern areas of said electronic circuit board to said circuit portion of said connecting member substrate.

14. The surface mount electronic assembly according to claim 13, wherein:

said surface of said connecting member substrate includes projections formed of said electrically insulating resin which support said circuit portion and which recess at least a portion of said non-circuit portion areas with respect to said circuit portion;

said projections having side walls, ones of said side walls facing and opposing ones of said side walls of adjacent ones of said projections; and said non-conducting adhesive is disposed between said facing and opposing ones of said side walls and is bonded to said coarsened surface of said non-circuit portion areas between said facing and opposing ones of said side walls so as to provide an anchoring by virtue of the non-conductive adhesive agent being between said facing and opposing ones of said side walls.

15. The surface mount electronic assembly according to claim 14, wherein top walls of said projections and said side walls are covered by said circuit portion.

16. The surface mount electronic assembly according to claim 15, wherein:

said connecting member substrate has first and second opposing substrate sides adjoining said bonding side, and said bonding side faces said electronic circuit board; and each of said projections is formed as a rib extends over a portion of said bonding side and a portion of at least one of said first and second opposing substrate sides so as to extend said circuit portion thereon to be on a corresponding one of said first and second opposing substrate sides.

17. The surface mount electronic assembly according to claim 16, wherein said projections on said bonding side are arranged in first and second groups respectively having said projections thereof extend onto said first and second opposing substrate sides, and said first and second groups are separated by said non-circuit portion areas recessed below said projections.

* * * * *